United States Patent [19]
Yamazaki et al.

[11] Patent Number: 5,350,937
[45] Date of Patent: Sep. 27, 1994

[54] NON-VOLATILE MEMORY DEVICE HAVING A FLOATING GATE

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[21] Appl. No.: 957,095

[22] Filed: Oct. 7, 1992

[30] Foreign Application Priority Data

Oct. 8, 1991 [JP] Japan .................. 3-290720

[51] Int. Cl.$^5$ .............. H01L 29/68; H01L 29/78; H01L 27/10
[52] U.S. Cl. .................. 257/316; 257/314; 257/315; 257/324; 257/331; 257/390
[58] Field of Search ........ 257/314, 315, 316, 324, 257/331, 390

[56] References Cited
U.S. PATENT DOCUMENTS

| | | | |
|---|---|---|---|
| 4,774,556 | 9/1988 | Fujii et al. | 257/316 |
| 4,929,988 | 5/1990 | Yoshikawa | 257/316 |
| 5,017,977 | 5/1991 | Richardson | 257/316 |
| 5,053,842 | 10/1991 | Kojima | 257/316 |
| 5,071,782 | 12/1991 | Mori | 257/315 |
| 5,078,498 | 1/1992 | Kadakia et al. | 257/316 |
| 5,146,426 | 9/1992 | Mukherjee et al. | 257/316 |

FOREIGN PATENT DOCUMENTS

| | | | |
|---|---|---|---|
| 61-256673 | 11/1986 | Japan | 257/316 |
| 62-76563 | 4/1987 | Japan | 257/316 |
| 1-291470 | 11/1989 | Japan | 257/316 |

*Primary Examiner*—Ngan V. Ngo
*Attorney, Agent, or Firm*—Sixbey, Friedman, Leedom & Ferguson

[57] ABSTRACT

A MOS type semiconductor device comprising a protruded part provided on a semiconductor substrate, a semiconductor film formed on the side surface thereof, which is defined as a floating gate, and a gate electrode covered with the semiconductor film. In particular, a MOS memory device manufactured by providing a number of the above-mentioned semiconductor devices, by forming an impurity region on top of the protruded part of each semiconductor device, by forming a contact on the impurity region, and by providing a wiring that crosses a gate wiring.

12 Claims, 8 Drawing Sheets

FIG.I(A)
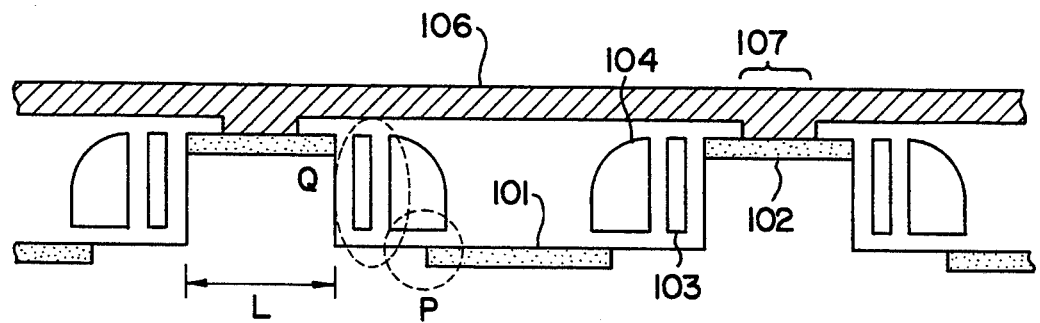
FIG.I(B)
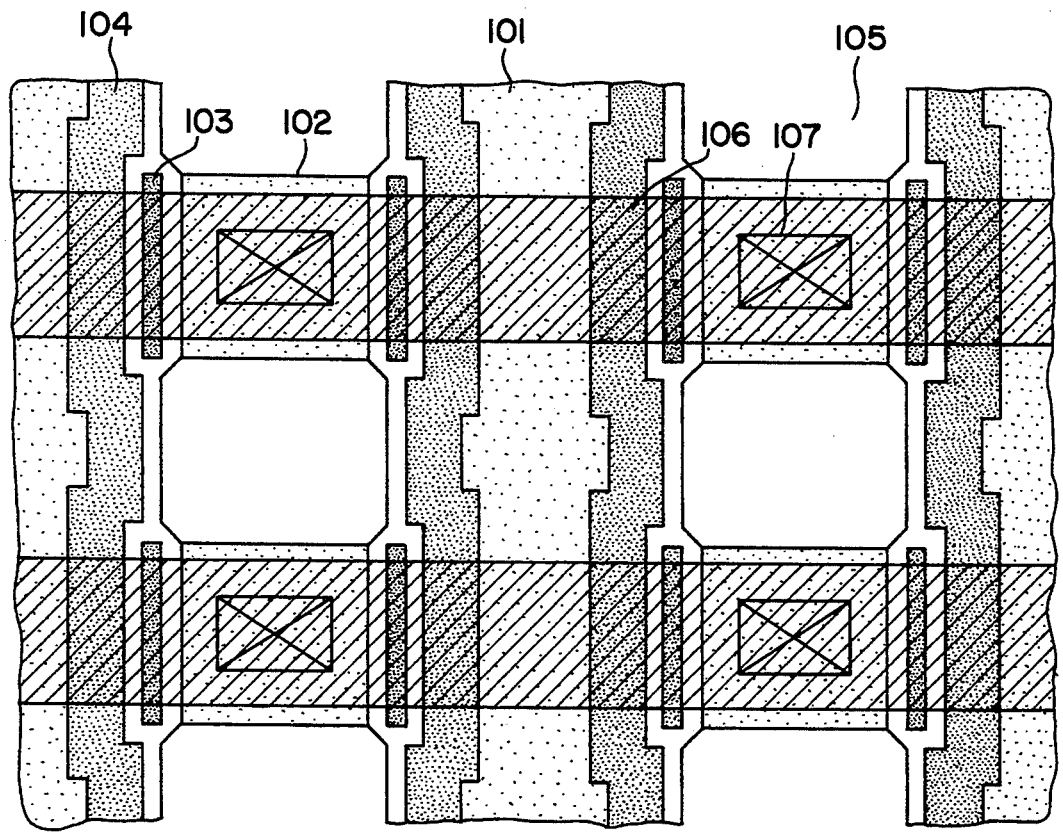

F I G. 8(A)
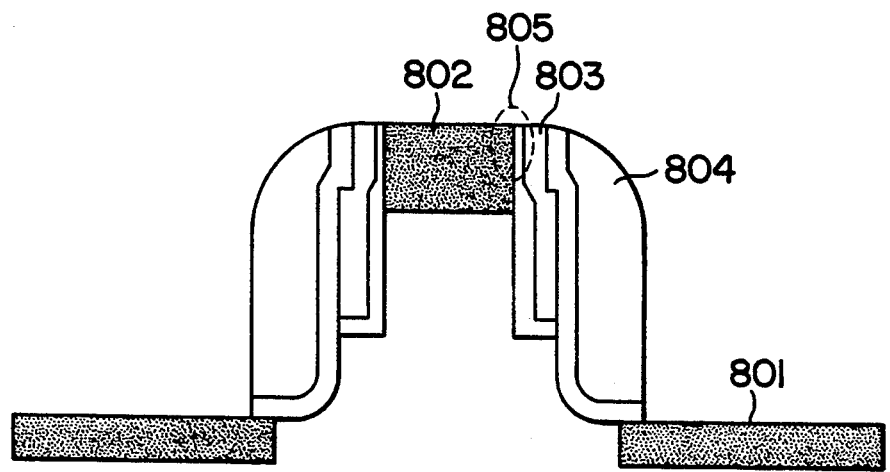
F I G. 8(B)
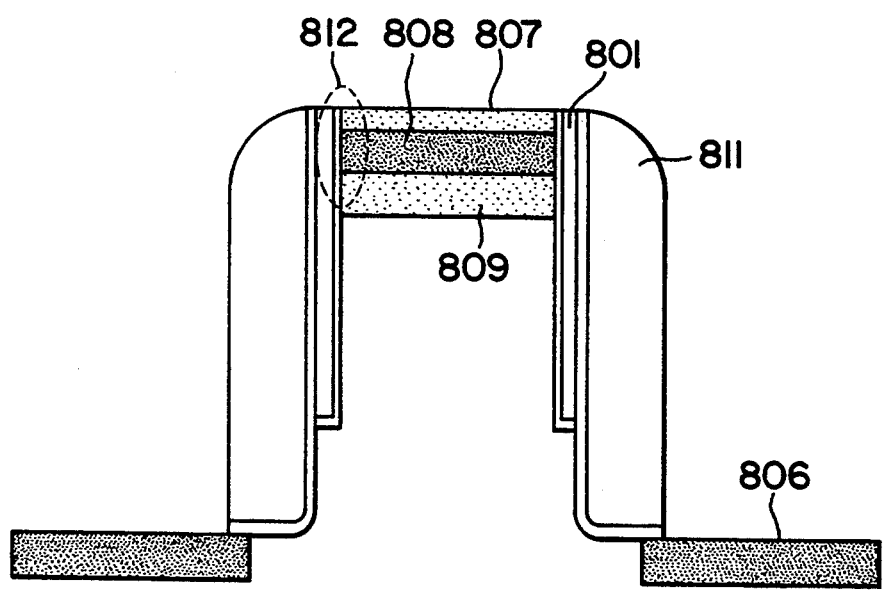

NON-VOLATILE MEMORY DEVICE HAVING A FLOATING GATE

BACKGROUND OF THE INVENTION

1. Field of The Invention

In the present invention, a semiconductor device which is suitable for the high integration is suggested, and the manufacturing method thereof is disclosed. The semiconductor device in accordance with the present invention is particularly used for a non-volatile memory device having a floating gate.

2. Description of The Prior Art

A lot of research development relating to the finer structure and higher integration of semiconductor device have been under progress. Above all, the achievement of refining technique of insulated gate field effect semiconductor device which is called MOSFET is remarkable. The word MOS represent the initials of Metal-Oxide-Semiconductor. The metal means not only pure metal but also a semiconductor material of sufficiently large conductivity as well as the alloy of semiconductor and metal, in wider definition. Besides a pure oxide film, the insulator such as nitride film can be used instead of the oxide film of metal and semiconductor, and in which case, the terminology of MOS is not necessarily appropriate, however, the field effect device having these kind of structures, including nitride and the other insulators, are called MOSFET or MOS transistor, in the present description.

In a normal MOS transistor, an oxide film (insulator) such as silicon oxide, is formed on a semiconductor surface as a gate oxide film (insulated gate film), on which a metal or semiconductor and the like which works as a gate electrode, is provided, and by controlling the electric potential of the gate electrode, the conductivity of the semiconductor of a base, is controlled.

When a semiconductor film which is electrically independent (floating gate) is formed on the gate oxide film, and another insulated film is formed thereupon, so as to provide a gate electrode (control gate), it is conventionally known that this can be used as a device of non-volatile memory. The memory having such a structure is commercially sold as EPROM or EEPROM. The basic idea of this memory is to fix the conductivity of the semiconductor of the base semipermanently by applying strong electric field to a control gate electrode, and whereby trapping a charge such as electron and hole on an intermediate floating gate film, and by having this electrified in a specific conductive mode. In a case that the charge injected in the floating gate is removed by means of the irradiation of ultraviolet or by some electric effect, the initial state is recovered, i.e. a certain data is erased. The MOS transistor having the floating gate of this kind is utilized as a memory cell transistor.

Since a power source is not needed for the memory utilizing this kind of device to retain memory, which is not the case with RAM such as DRAM or SRAM, and a capacitor is not needed, in particular, in comparison with the DRAM, when a memory of no less than 16 M bit is to be manufactured, the cell area per bit can be reduced, which fact means higher integration, and the research relating to this field has recently become even more intense. The EEPROM with which an erasing operation can be carried out electrically, in particular, has drawn much attention.

When higher integration is to be achieved, however, there are a number of problems remain to be solved under current situation. When a memory device is to be manufactured using this kind of device, the memory cannot be formed out of the device only, but a selective transistor has to be formed along with the device. The structure of the EEPROM of the most advanced high integration of prior arts is shown in FIG. 2(A). Referring to the figure, 201 is a source region, 202, a drain region, 203, a floating gate, and 204 is a control gate. The device is integrated from the viewpoint of structure, however, the area surrounded by dots P in the figure, works as a selective transistor, and the area surrounded by dots C) works as a memory cell transistor from the viewpoint of function.

When a data is to be written into a memory transistor, high voltage (normally not less than 10 V) is applied to the drain 202 and the control gate 204, so as to inject a charge into the floating gate 203, while, in order to erase the data, when a high electric field is applied to the drain, under a condition that the electric potential of the control gate 204 and the source 201 are maintained at the same level, the charge of the floating gate can be extracted. Since the characteristic of insulating film is deteriorated if the writing and erasing operation is repeated too many times, the upper limit of the number of operation is said to be 100,000.

In order to inspect whether there is a data or not, after a normal voltage for operating the MOS transistor, is applied to the drain 202, a normal voltage is applied to the control gate 204. By so doing, the selective transistor P is turned "ON". If a charge (electron(hole), if a semiconductor substrate is P-type (N-type) while source and drain are N-type(P-type)) is trapped on the floating gate of the memory cell transistor Q, since the memory cell transistor is not affected by the electric field of the control gate above, current is not run. When there is no charge in the floating gate, or when the floating gate is electrified instead, since the floating gate is affected by the control gate, and is thus turned "ON", current is run.

The description supra is an example of general EEPROM, while there are some variations according to which is injected into the floating gate, electron or hole, and whether a charge is injected or removed at the time of writing, and the basic concept is to extract the state of a memory cell transistor to the outside through a selective transistor.

In practice, a memory device is put into function only after a lot of devices are provided in line, so as to form a wiring shown in FIG. 2(B). Referring to the figure, X, X' are word lines, and Y, Y' are bit lines. When a specific bit wiring is observed under a condition that any of the word wirings is chosen, a signal is detected when a data is stored in the memory cell transistor on the point where the word line and the bit line are crossed with each other, and when the data is not stored therein, the signal is not detected.

In a simplest model, one of the integrated devices can be used as a memory cell of one bit, however, in order to increase accuracy, two of the same cells are prepared, with a data written into one cell, And no data in the other one, and the signals from these two cells are compared with each other. Namely, if there is a difference in the electric potentials of the signals transmitted from these two cells, it is judged that there is a data, and that there is no data when there is no difference in the electric potentials. Although a memory capacity is reduced to half if this method is adopted, the adoption of this method is preferred to increase accuracy when noise begins to be superimposed on the bit line, as the higher integration is proceeded.

The transistor device of this kind has several problems with regard to high integration. First, as shown in FIG. 2(A), as the width of the device, $L_1+L_2$ is a lower limit. The minimum values of $L_1$ and $L_2$ represent process accuracy, and in the current technological situation, 0.5 micrometer is a limit when mass productivity is considered.

At least 1 micrometer is thus required for the gate part alone of this device. As this is a critical problem concerning the whole system of the MOS semiconductor device in a broader perspective, it is necessary to provide a contact on a source and drain region, and it is required that the slightly larger area should be allocated for the contact, which is located below the gate part. Namely, the entire device source region is connected into a ground level, or into a power supply line, while a contact of several micrometer of diameter is formed on the drain region, and a metal wiring is crossed with the gate wiring. In this case, the metal wiring should be located on the upper layer of the gate wiring, and should be lead down to the drain region formed on the substrate surface through a hole formed on an interlayer insulating film. For this reason, there is a long distance in the connected part from the contact part to the bit line, and the breaking of the wiring or the contact failure should become an important problem. For example, the technique of burying a contact hole by the CVD deposition of tungsten was worked out to deal with such a problem. If the special technique of burying the contact hole is not to be used, the other techniques of enlarging the area of the contact, of widening the contact hole, or of forming the contact hole into a conical shape, must be needed, however, all of them are reverse ways to high integration.

Next problem is that a self-aligning method is not adopted when an EEPROM is to be manufactured, which results in the increase in the number of mask processes. Practically, for the EEPROM to be operated, it is required when a tunnel current is injected from the drain that the floating gate 203 is superimposed on the drain region 202 to a certain degree. When a planar photolithography technique is adopted to obtain the superimposition, since the displacement of no less than 0.2 micrometer of a photomask must be considered under the current technique, in order to ensure that the drain region is superimposed on the floating gate, the superimposed region of at least 0.4 micrometer is required. If the size of the region is not more than this level, the displacement of the superimposition will be no less than 50%, which will cause a critical problem for the yield of the device.

The manufacturing of the memory region of the conventional EEPROM includes at least the following processes to name only the principal ones. Roman numerals on the far right end are the number of mask processes.

(1) To form a device separate region (LOCOS) on a semiconductor substrate. ......I
(2) To form a drain region 202. ......II
(3) To form a floating gate. ......III
(4) To form a control gate (word line). ......IV -continued (5) To form a source region 201.
(6) To form an interlayer insulator, and to form a contact hole on the drain. ......V
(7) To form a bit line. ......VI Almost all processes like this need mask process (it is only (5) that does not need a mask, because it can be formed by self-align method), It is required of all of those processes that the accuracy is 0.2 micrometer or less. Therefore, in conclusion, con, pared with DRAM(5 pieces of mask processes), yield decreases.

EEPROM is regarded as a memory element which will replace DRAM in the future as a peculiar non-volatile memory named flash memory. If its yield is high, the unit price by one bit will be relatively expensive and its competitiveness will be weak.

SUMMARY OF THE INVENTION

The purpose of the present invention is to solve a part or the entire problem as suggested supra. Namely, in the present invention, a device structure of higher integration and the process to achieve this, are suggested. Also, in the present invention, the number of mask processes is reduced, or the accuracy required for the mask process is mitigated, and the device structure to improve yield and the process to achieve this are suggested.

According to the present invention, the problems stated supra are solved by arranging a MOS transistor which has been conventionally arranged two-dimensionally, in a three-dimensional way. Namely, by standing the region to be a channel between source and drain, upright, which has been conventionally arranged on a flat surface, the area occupied by the region can be curtailed. The basic idea of the present invention is to form a protruded part on a semiconductor substrate, to define the side surface of the protruded part as a region to form a channel, and to define the top part thereof one of impurity region (source or drain), while the other in, purity region is provided on the bottom, so as to form a gate electrode on the side surface of the region to form a channel. As a result, it is also required that the gate be stood upright, however, in case of EEPROM, for example, two kinds of transistors, i.e. a memory transistor having floating gate and a selective transistor having a normal structure must be formed. The present invention is characterized by arranging the selective transistor part of the EEPROM in a two dimensional way, while the memory cell transistor part thereof is stood upright, in order to simplify manufacturing.

It should be easily presumed that the present invention, when applied to a general MOS transistor other than to a special transistor such as EEPROM, leads to the curtailment of the area or high integration, while it is extremely convenient when a contact is to be formed on the impurity region that one of the impurity regions is formed on the position higher than the gate electrode and wiring. It is thus preferred to apply the present invention both to a memory region and to a peripheral region thereof, when, for example, an EEPROM device is to be manufactured.

A schematic diagram to display the technical idea of the present invention is shown in FIG. 1. Although the detailed information is not necessarily described accurately, this will be enough to understand the concept of the present invention. A schematic diagram of the cross section of the device of EEPROM in accordance with the present invention is shown in FIG. 1(A). Four devices are shown in the figure. Although the device situated on the far right end but one is explained in the following, the same explanation applies to the other devices. As shown in the figure, a protruded part is provided on the semiconductor substrate, and the topmost part thereof is a drain region 102. When an EEPROM is to be formed, the thickness of the drain region is determined in a refined manner so as to achieve optimal superimposition with the floating gate, or when the device is to be used as a normal MOS transistor, the thickness of the drain region must be as thin as possible. When the same structure as LDD is to be formed, at least two steps of impurity layers of different impurity concentrations may be formed.

When a tunnel current is effectively injected into, or removed from the floating gate of EEPROM by field emission, the gate oxide film on a specific area of the conventional EEPROM is manufactured extremely thin, and a special patterning process is needed for that purpose.

When the same area as this is to be formed in accordance with the present invention, it can be done by changing the composition of the impurity region. Namely, the layer of higher impurity concentration is sandwiched between the layers of lower impurity concentration. By this arrangement, the electric field is effectively focused on the region of higher impurity concentration in the center, and a tunnel current can thus be run.

In order to form the impurity region, the vertical diffusion of impurity should be controlled, and in practice, it can be controlled by a fine tuning at a level of 20 nm in depth. A drastically fine in, purity region can thus be formed compared with that formed in the conventional planar type MOS transistor.

On the other hand, a source region 101 is provided on the bottom of the semiconductor substrate. A floating gate 103 and a control gate 104 are also formed on the protruded part in such a manner that they are adhered to the upper part thereof. If the formation of the floating gate is omitted, the device is to be used for a normal MOS transistor.

In addition, the impurity region 102 is connected with a wiring 106 that works as a bit line through a contact hole 107. The present invention is advantageous even when the wiring such as bit line is to be formed. Namely, since one of the impurity regions is situated higher than the gate electrode, the contact hole as deep as in a conventional case is not needed according to the present invention. The area to be allocated for the contact can be drastically reduced compared with the prior art, while there is little problem of disconnection and contact failure, and the yield can thus be improved.

In a prior art, when the depth of the contact hole is intended to be shallower, the wiring must be arranged vertically uneven corresponding to the unevenness of the gate wiring. The existence of the unevenness directly leads to the problem of the disconnection of wiring. On the other hand, when the wiring is formed by flattening an interlayer insulator, in order to reduce the unevenness, the contact hole must be formed deeper.

According to the present invention, it is possible to form a shallow contact hole, and to reduce the vertical unevenness or step difference of the wiring, and this sole achievement can lead to the drastic improvement of the yield.

It should be noted that the memory transistor as shown by dots Q in the figure is formed vertically, while the selective transistor shown by dots P is formed flat, in the device of the above-mentioned form.

Further it should be also noted that the problem of the limit of fine process as stated in the description of EEPROM supra, is virtually determined by the width L of the protruded part, according to the example shown in FIG. 1. As this is clear from the process to be explained infra, a mask process does not virtually exist when the gate part is formed. The shape of the gate part is determined by forming the protruded part on the base thereof, while the thickness thereof and so on, is determined by the thickness of the film used for the formation of the gate part, as well as by the degree of anisotropic etching. If the present invention is adopted, even when the minimum process accuracy is 0.5 micrometer, the width required for one device is not more than 1 micrometer, or 0.5 micrometer when it is arranged at the highest density, compared with at least 5 micrometer required in the prior art (FIG. 2).

Referring to FIG. 1(B), the EEPROM formed by combining the device in a matrix form, is seen from above. A memory of 8-bit exists in this figure. Referring to the figure, a numeral 101 is a source region, which is arranged in parallel to a gate wiring in an integrated form, and which works as a power source supply line, and 102 is a drain region formed on top of the protruded part, while 103 is a floating gate vertically formed on the side surface of the protruded part, and 104 is a control gate. The control gate 104 is linked lengthwise with each other, so as to form a word line, in the figure. A numeral 105 represents a thick insulator which is provided in order to separate each device of the protruded part, and which has the same function as a conventional LOCOS. A numeral 106 represents a bit line, which is connected with each drain region through a contact hole 107.

A circuit diagram of FIG. 1(B) is shown in FIG. 6. It is now presumed that electrons are not injected into the floating gates of all devices, and that the electron is injected only into the floating gate of the device of $T_{13}$. For that purpose, the electric potentials of power source supply lines (source wirings) $S_1 S_2$, $S_3$ are maintained at zero level, while the electric potentials of word lines (gate wirings) $G_1$, $G_2$, $G_4$ are defined as $V_0$, and that of a bit line (drain wiring) $D_1$ as $V_2$, and that of $D_2$ as $V_3$. At this tinge, the voltage between the gate and drain of each device $T_{11}$, $T_{12}$, $T_{14}$ is $(V_0-V_2)$, while it is $(V_1-V_2)$ for the device $T_{13}$, and $(V_0-V_3)$ for devices $T_{21}$, $T_{22}$, $T_{24}$, and it is $(V_1-V_3)$ for a device $T_{23}$. If a difference in electric potential of no less than Vth is generated, and a tunnel current is caused thereby, and when an electron is to be injected, the following inequality should be satisfied:

$$-V_{th} < V_0 - V_2 < V_{th}$$

$$V_1 - V_2 > V_{th}$$

$$-V_{th} < V_0 - V_3 < V_{th}$$

$$-V_{th} < V_1 - V_3 < V_{th}$$

The lower limit is set for each difference in electric potential, and this is because the data already stored is erased (the electron already exists escapes from a floating gate), when the voltage of no less than that level is applied. Since this is a quaternary inequality, and it is complicated to determine a general solution, however, when $V_{th}=2V$, $V_0=0$, $V_1=2V$, $V_2=-V$, $V_3=V$ is one of the solutions, and in this case, $V_0-V_2=V$, $V_1-V_2=3V$, $V_0-V_3=-V$, $V_1-V_3=V$, which satisfies the above-mentioned condition. Namely, by defining the voltage to be applied to the word line as two kinds of 0V and 2V, and by defining the voltage to be applied to the bit line as two kinds of V and $-V$, information can be input into a certain device.

This is an example of an operation, and various other operational modes can be presumed, which will not be mentioned herein.

In order to manufacture the structure as shown in FIG. 1, there are several methods, and the typical processes thereof are as follows:

| | |
|---|---|
| (1) To form an impurity region (drain) on the surface of a semiconductor. | |
| (2) To form a protruded part. | ••••••I |
| (3) To form a film that will be a floating gate. (film formation and anisotropic etching) | |
| (4) To form a device separate region and to etch off an unnecessary part. | ••••••II |
| (5) To form a control gate. (film formation and anisotropic etching) | |
| (6) To form an interlayer insulator and to form a contact hole. | ••••••III |
| (7) To form a source region. | |
| (8) To form a drain wiring. | ••••••IV |

Roman numerals on the far right end are the number of mask processes.

Although the number of processes seem to be increased, actually, the number of mask processes can be reduced drastically. Since the mask process is not related particularly to the manufacturing of the part relating to tile EEPROM structure, the number of mask processes for manufacturing a normal MOS transistor in accordance with the present invention will not be changed.

Examples of process for executing the present invention are shown in FIGS. 3 and 4. When the device such as EEPROM will be formed in a large size in accordance with the present invention, the manufacturing must be carried out by carefully separating each transistor. For that purpose, various conventional interdevice separating techniques including LOCOS method as shown in FIG. 4 may be adopted.

Referring to FIG. 4, an example of inter-device separating technique is explained. First, an in, purity region 402 is formed on a semiconductor substrate 401. As the semiconductor substrate, various semiconductors can be used, and when silicon is used, (100) orientation surface is to be utilized, since, in this case, the side surface as well as the flat surface of the substrate will be of (100) orientation. The thickness of the impurity region is 10–500 nm. The optimal thickness is designed according to the purpose of the device. When the device is used as EEPROM, for example, the thickness should be 100–500 nm, so as to promote the injection of charge into the floating gate. When it is to be used as a normal MOS transistor, since the superimposition thereof with a gate electrode will be increased, if the thickness of the layer is large, thus the layer is preferred to be thinner. When the impurity region is formed into at least two different impurity concentrations, the structure of the region will be close to that of LDD used for a planar type MOS transistor.

With regard to the formation of the impurity region, the method of impurity diffusion utilizing a known ion in, plantation and so on, can be adopted, or a semiconductor including in, purity can be epitaxially grown on a semiconductor substrate. Otherwise, a polycrystalline semiconductor including impurity can be simply formed. All of these methods are known, and when either method is adopted, its advantage and drawback should be taken into consideration. Of these, the method of impurity diffusion must be the most general one. Regarding the method of epitaxial growth, if silicon is used, its growth temperature is so high that unintended diffusion of impurity will occur, however, since the crystal interface of the semiconductor is clean, and this method is considered to be suitable for a compound semiconductor such as gallium arsenide. The formation of polycrystalline semiconductor is a relatively simple method, and a defect is easily generated on the interface of a single crystalline semiconductor and a polycrystalline semiconductor.

Then, the semiconductor substrate is etched in a stripe, so as to form a groove 403, as shown in FIG. 4(B). A known photolithography method can be used for this process.

A film 404 which has a preferential oxidation-resistant function is formed on the surface of the substrate, as shown in FIG. 4(C). At the tinge of the formation, the film of silicon nitride must be formed into the fine part of unevenness. For that purpose, besides a conventional low pressure CVD, a photo-CVD method which gives little damage to the substrate and which has good step coverage, may be adopted. A film such as silicon oxide can be formed under the silicon nitride in order to mitigate stress.

In this manner, a part of the semiconductor substrate is exposed, while the other part is covered with the silicon nitride film and the like. When the substrate is oxidized by the method such as steam oxidation, the part which is not covered with the film 404 such as silicon nitride is oxidized, and a thick oxide film 405 is formed thereby. By removing the film such as silicon nitride, the structure shown in FIG. 4(D) can be obtained. In this manner, a device separate region is formed. Although the oxide film is formed in such a way that the groove part is segmented thereby, according to the figure, when the bottom (recessed part) of the substrate is to be used as a power source supply line at the time of adopting this pattern, since the part is segmented later by the oxide film 404, the power source supply line can not be formed. For this reason, a part or the whole part of the bottom of the groove must be preliminary covered with the film such as silicon nitride, so as not to oxidize the part corespondent to the power source supply line. Regarding the above-mentioned method, a conventional LOCOS method is applied unchanged to the present invention, however, there are some inconveniences in this method, which must be altered as required.

When EEPROM and the like is to be manufactured, a semiconductor film for forming a floating gate must be formed along the side surface of the protruded part, however, since this is formed continuously along the side surface of the semiconductor, it must be segmented at each device later by a photolithography method. Since the operation of segmentation is consequently the same as the separation between each device, the formation of oxide film and the patterning of floating gate can thus be carried out at the same time. Namely, a mask process can be curtailed by carrying out the process of inter-device separation afterwards.

The detailed process will be described infra with reference to FIG. 3. A case of manufacturing EEPROM will be described in the following. The description infra is related to a rough process, and there is a case where a part thereof may be altered in order to obtain a certain characteristic required by an executor of the present invention.

A protruded part 302 is formed on a semiconductor substrate 301 by using all or a part of the manufacturing methods shown in FIG. 4. The width of the protruded part is determined by the design rule to be adopted, or is defined as 500 nm for example. Although a finer pattern can be formed by adopting a technique such as electron beam exposure or X-ray exposure, the characteristic of the device to be obtained and the limitation of the contact to be formed later must be considered in order to design the pattern. The height of the protruded part is desired to be of the same level as the width of the protruded part, however, this rule may have an exception, since the height is a factor to determine the channel length of a memory transistor. The appropriate height is 200–800 nm. An impurity region 303 is formed on top of the protruded part 302. An oxide film 306 that works as a gate oxide film is then formed by a method such as thermal oxidation. The thickness of the film is desired to be 10–500 nm. When silicon is used as the semiconductor, a silicon oxide formed by a known thermal oxidation is appropriate. The thermal oxidation, in particular, is suitable, for an oxide film can be formed homogeneously even on the side surface of the protruded part.

In addition, a semiconductor film (silicon or germanlure and so on) 306 is formed thereupon. The preferred thickness is 10–500 nm. When a high integration is particularly aimed, the film is preferred to be thinner. The formation of this film also must be carried out with good step coverage. Much attention must be paid to the formation of the film on the side surface of the protruded part where the film formation is not easily carried out. The structure shown in FIG. 3(A) can thus be obtained.

The above-mentioned semiconductor film is etched by a known anisotropic (or directional) etching method such as bias reactive ion etching. The process may be finished only by the etching of the semiconductor film, however, in order to perfectly etch off the semiconductor film other than the side surface thereof, the silicon oxide film on the base or the substrate can be etched to some degree. In this manner, the structure shown in FIG. 3(B) is obtained. In the process of this etching, the semiconductor film other than that on the side surface of the protruded part is perfectly removed. Although a semiconductor film 307 remains on the side surface, since the semiconductor film will be peeled off when the adhesion is not so good between the semiconductor film and the oxide film of the base, sufficient attention must be given to the manufacturing of the semiconductor film.

The etching of even the semiconductor substrate is shown in FIG. 3(B), and this kind of overetching generates the effect of lengthening a region to form a channel, afterwards, when a selective transistor is formed. When the channel length is too short, the problem of short channel effect is generated, and a proper level must be maintained, while the effective function of this process at the time of determining the channel length is also a characteristic of the present invention.

After the process shown in FIG. 3(B) is finished, a process of segmenting the semiconductor film 307 formed continuously along the groove, is carried out at each device, although this is not shown in the figure. If the process of the device separation has not been carried out at first, an inter-device separate region can be formed at this time. This process is shown in FIG. 5.

Cross sections of the upper parts of two protruded parts are shown in FIG. 5. A semiconductor film is formed on the side surface of each protruded part by the processes shown through FIG. 3(B). A silicon oxide film (10–500 nm in thickness) and a silicon nitride film 501 (20–400 nm in thickness) are formed thereupon. In order to form the film, it is required to carry out good step coverage. A photoresist 502 is applied on the entire surface, and is exposed, so as to remove a resist of the part which will be an inter-device separate region (the part which will form an oxide film). The process is shown in FIG. 5(A).

Isotropic etching is carried out under this condition. Aniosotropic etching is not appropriate since there is a possibility that the side surface of the protruded part is not etched. The silicon nitride film is removed by the etching process, which is shown in FIG. 5(B). Finally, an oxide film 503 is formed by preferentially oxidizing only the region on which the silicon nitride film is removed, by thermal oxidation method. The preferred thickness of the oxide film is 0.1–1.0 micrometer. This process is shown in FIG. 5(C). For the process of the oxidation, the oxidizing condition of the LOCOS method utilized for manufacturing the conventional planar type semiconductor device, can be adopted. By the oxidation process, the semiconductor film (correspondent to a numeral 307 in FIG. 3) on the side surface is oxidized at the same time.

Another method can be adopted. In the same way as shown in FIG. 5(A), for example, etching can be carried out while the necessary part of the resist is removed, so as to remove the impurity region on top as well as the semiconductor film on the side surface. Isotropic etching is preferred for this etching process. Then, an oxide film can be deposited, for example, in such a manner that the resist is retained by photo-CVD, and by removing the oxide film deposited on the resist by a lift-off method, so as to retain only the oxide film deposited on the region where there is no resist. At the tinge of adopting this method, it is required that the process can be carried out at a low temperature as a means to deposit the oxide film, and that the process should be carried out with a good step coverage.

Regardless of methods to be adopted, a mask process should be carried out only once for forming the device separate region. When the device separate region is preliminary formed according to the method as shown in FIG. 4, carrying out the segmentation of the semiconductor film 307 is enough, however, in that case, each one mask process for the formation of the device separate region as well as for the segmentation of the semiconductor film 307, i.e. total two times mask processes are required, in which case the deterioration in yield is anticipated. The processes explained supra can be summarized as follows:

---

Process A (1) To form an impurity layer. (FIG. 4, 402)

-continued

| | |
|---|---|
| (2) To form a groove. (FIG. 4, 403) | ••••••I |
| (3) To form a device separate region. (FIG. 4, 405) | ••••••II |
| (4) To form a semiconductor film. (FIG. 3, 307) | |
| (5) To segment the semiconductor film. (FIG. 3, 307) | ••••••III |
| Process B | |
| (1) To form an impurity layer. (FIG. 4, 402) | |
| (2) To form a groove. (FIG. 4, 403) | ••••••I |
| (3) To form a semiconductor film. (FIG. 3 307) | |
| (4) To segment the semiconductor film (FIG. 3 307) and to form a device separate region. | ••••••II |

Roman numerals on the far right end are the number of mask processes.

As is clear from the explanation supra, the number of masks necessary for the process so far is maximum three, or minimum two.

Referring to FIG. 3 again, after the semiconductor film 307 is segmented, a gate oxide layer 308, for example, is formed by a thermal oxidation method. A film 309 for forming a gate wiring (control gate) is formed thereafter. For the film 309, a semiconductor film of such as polycrystalline silicon, or a metallic film of such as tungsten or chrome, or a silicides of these, or a multi-layered structure of silicon and these, can be used. The structure shown in FIG. 3(C) is thus obtained. The film 309 other than on the side surface of the protruded part is removed again by anisotropic etching, so as to form a gate wiring 310. It should be noted that the gate wiring is formed along the side surface of the protruded part. It is also another characteristic of the present invention that the formation of this gate wiring is not carried out by a mask process.

An impurity region 311 is formed by a known method of impurity diffusion such as ion implantation. The impurity region is formed in a self-aligning mode by using the gate wiring 310 as a mask. In order to form a LDD region used for the conventional planar type MOSFET, another insulating film is formed on the gate wiring, and by carrying out anisotropic etching and whereby forming a spacer, this is used as a mask for further impurity diffusion. The detail of this process is not mentioned here. The technique stated in the Japanese patent applications Hei 3-238709 as well as Hei 3-238712, other inventions by the present inventors, can be used for the formation of the LDD.

Finally, an inter-layer insulating film 312 is formed. In order to form the inter-layer insulating film, a flattening technique such as a known etch-back method, can be used. A contact hole 313 is formed, and a metal wiring 313 is formed. A mask is needed for the formation of the contact hole, and for the patterning of the metal film. As mentioned supra, the contact hole in accordance with present invention can be sholeow, and is thus suitable for fine process. By the processes described supra, an EEPROM device is formed. The number of masks necessary for the process is four or five, and the number of masks which has been necessary for a conventional process can be drastically reduced. All of the processes mentioned supra are of basic character, and it goes without saying that some further processes should be added in order to form a device of higher additional values. On the other hand, some change may be added the above-mentioned process, for the processes for forming a peripheral circuit and a memory part differ from each other. The detailed description of each process is not mentioned in the present invention.

Several examples of embodiment utilizing the present invention are picked, and are explained below:

BRIEF DESCRIPTION OF THE DRAWINGS

These and other objects, features, and advantages of the present invention will become more apparent from the following description of the preferred embodiments taken in conjunction with the accompanying drawings, in which:

FIGS. 1(A) and 1(B) show schematic diagrams of an EEPROM device in accordance with the present invention.

FIGS. 8(A) and 8(B) show examples of EEPROM devices in accordance with the present invention.

DETAILED DESCRIPTION OF THE PREFERRED EMBODIMENTS

Preferred Embodiment 1

Figure 2A:
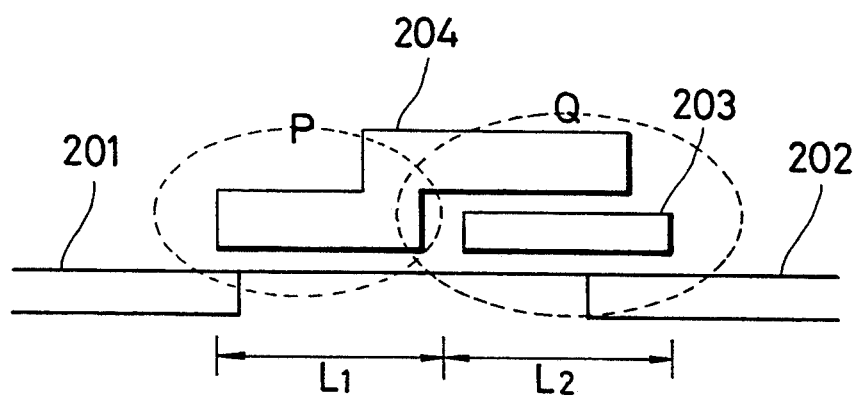
FIGS. 2(A) and 2(B) show schematic diagrams of an EEPROM device in accordance with a prior art.
Figure 2B:
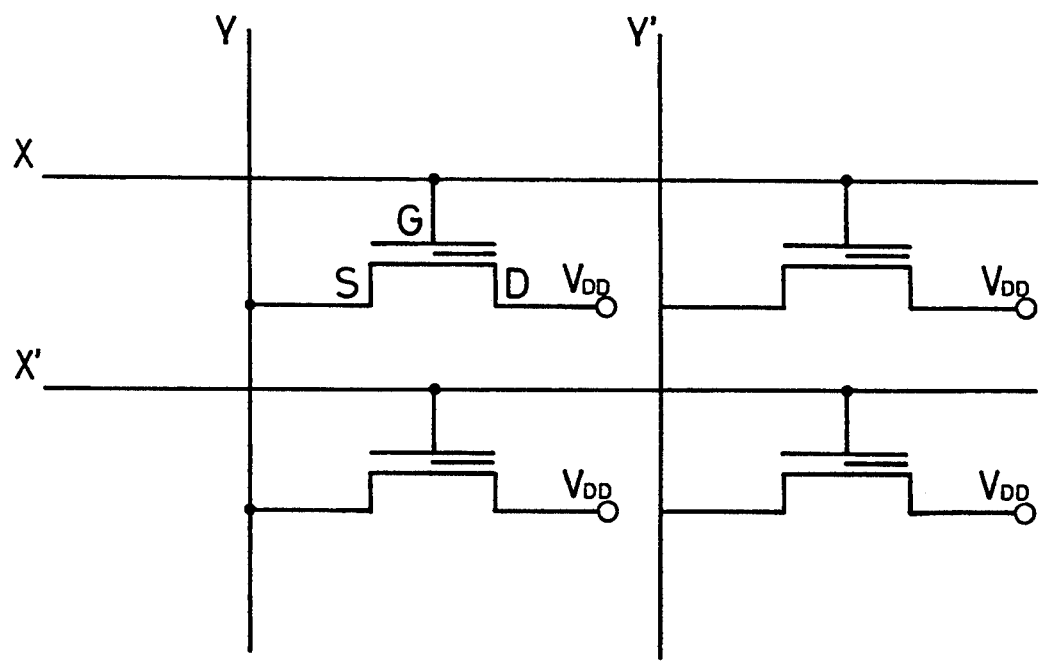
Figure 3A:
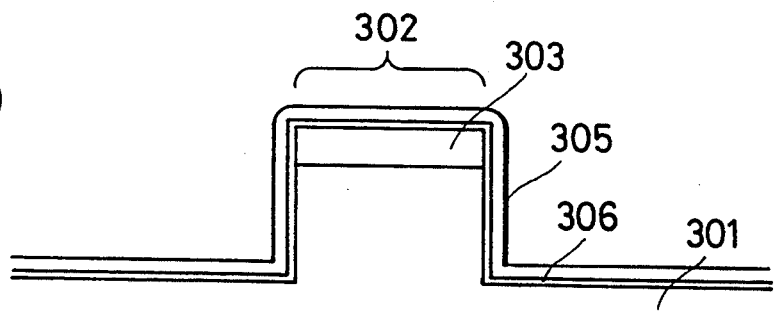
FIGS. 3(A) and 3(B) show an example of manufacturing process of an EEPROM device in accordance with the present invention.
Figure 3B:
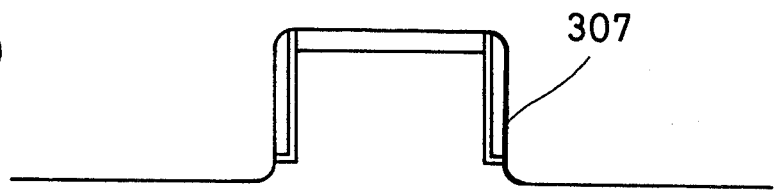
Figure 3C:
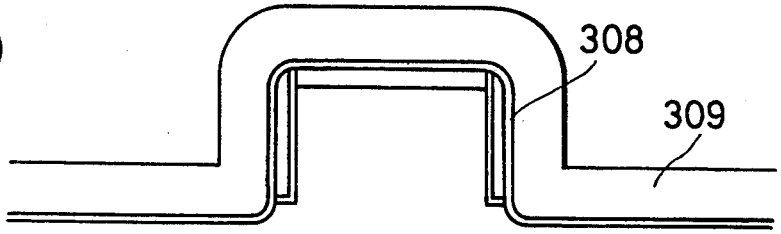
Figure 3D:
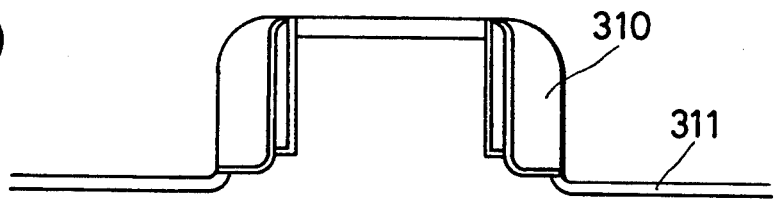
Figure 3E:
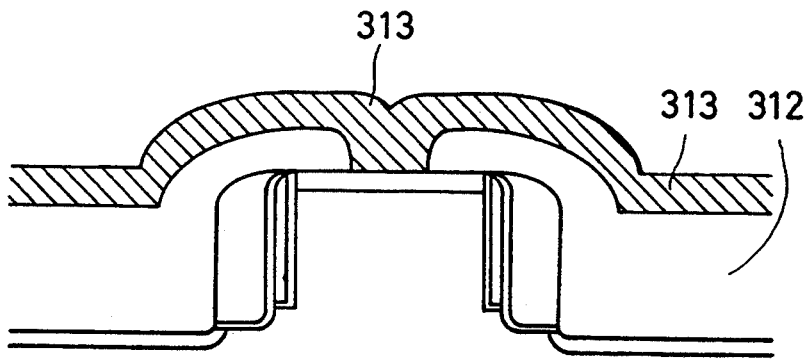
Figure 4A:
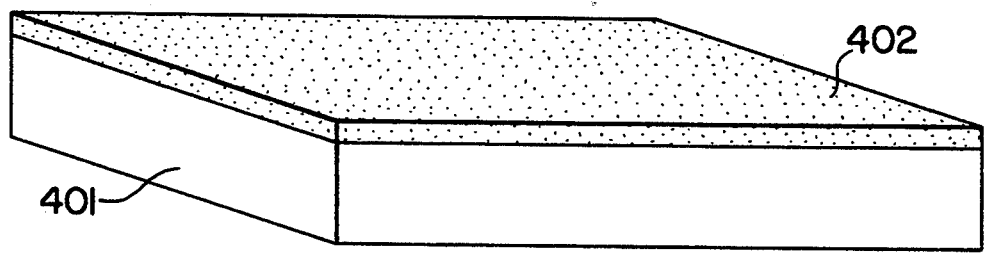
FIGS. 4(A) and 4(B) show an example of manufacturing process of a protruded part and of a device separate region in accordance with the present invention.
Figure 4B:
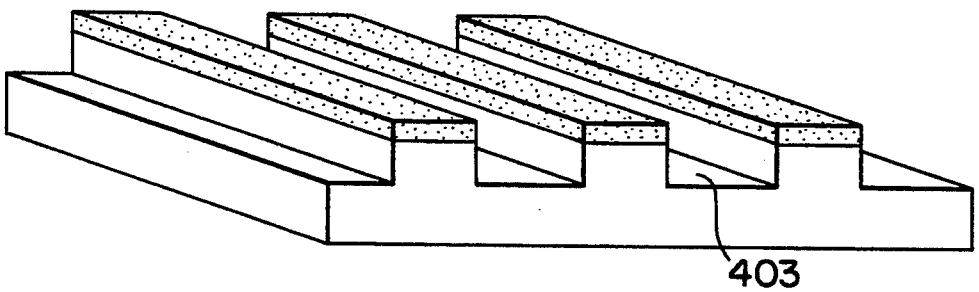
Figure 4C:
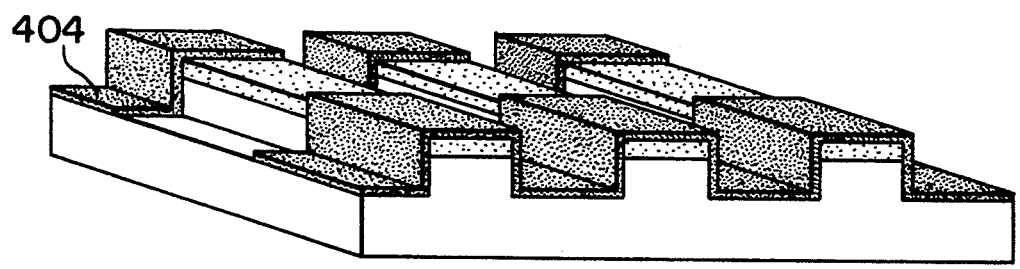
Figure 4D:
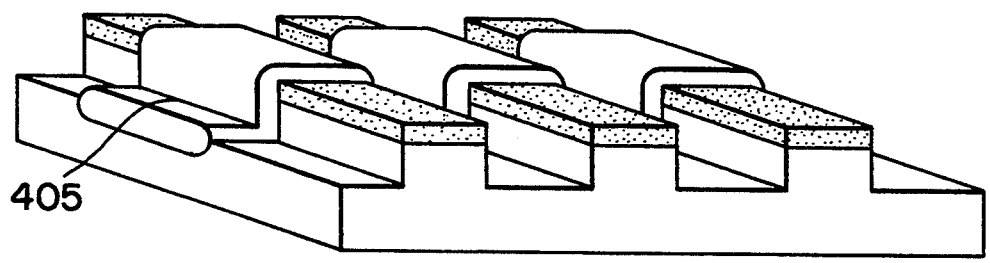
Figure 5A:
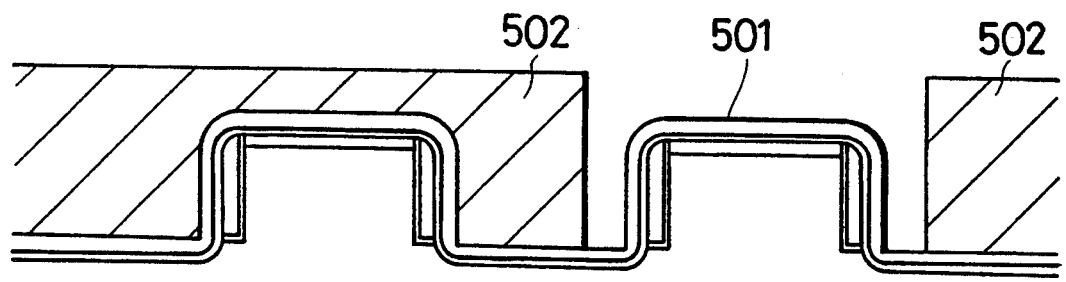
FIGS. 5(A) and 5(C) show an example of manufacturing process of a device separate region in accordance with the present invention.
Figure 5B:
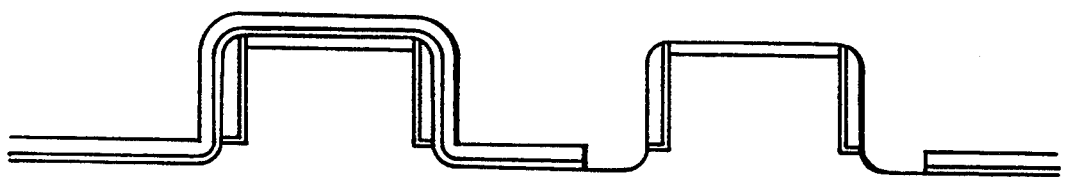
Figure 5C:
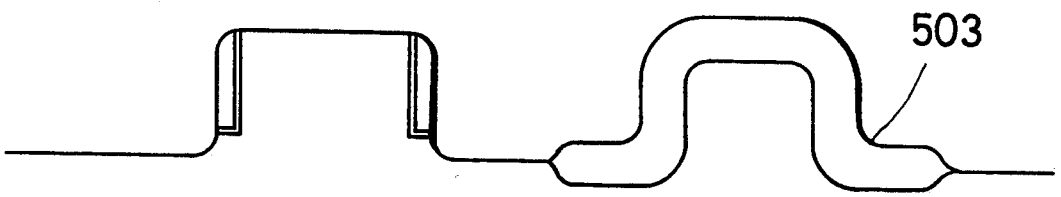
Figure 6:
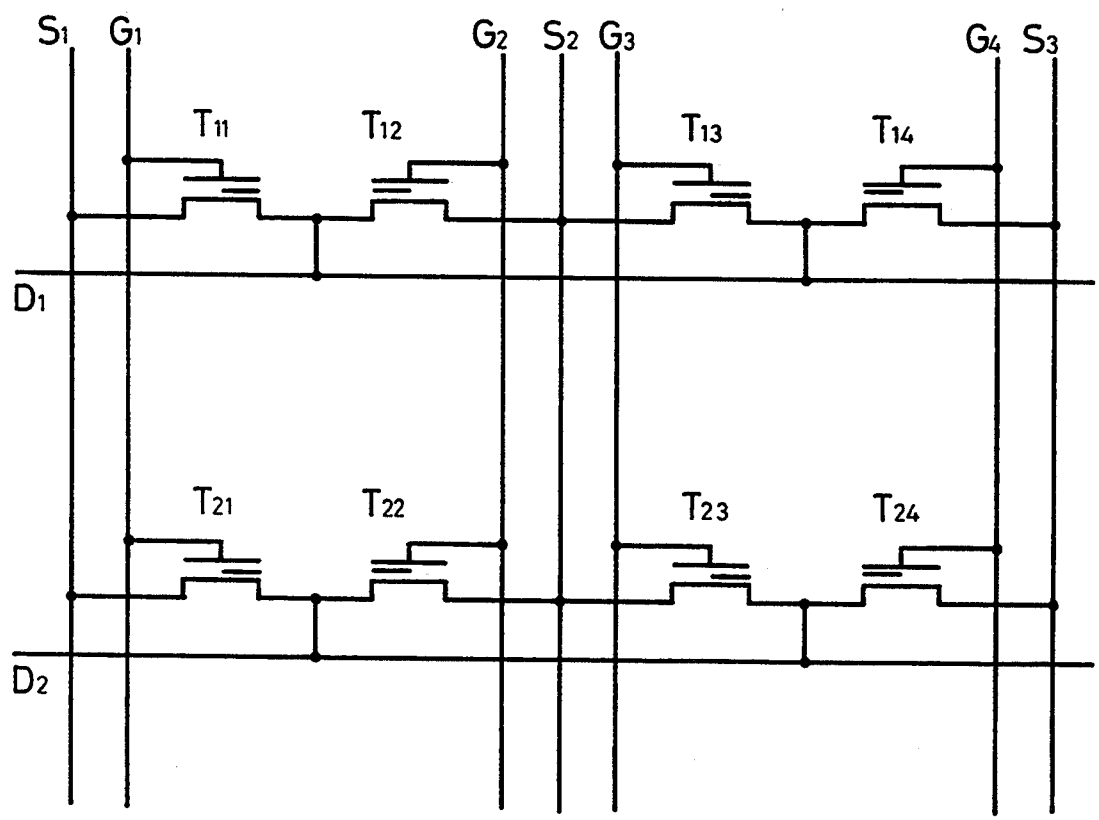
FIG. 6 shows a circuit diagram of an EEPROM device in accordance with the present invention.
Figure 7A:
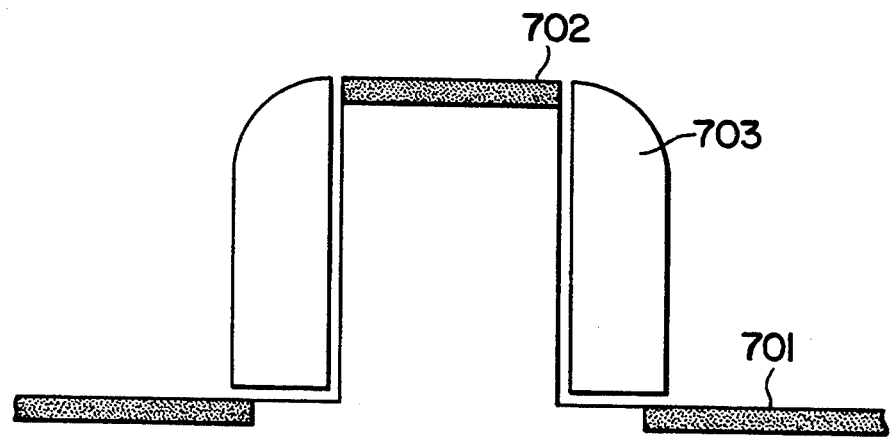
FIGS. 7(A) and 7(B) show examples of a MOSFET's in accordance with the present invention.

A first preferred embodiment is shown in FIG. 7(A). The example shown in FIG. 7(A) represents a MOS transistor (two transistors are depicted in the figure) formed on the semiconductor substrate having a protruded region in accordance with the present invention.

Referring to the figure, numerals 701 and 702 are impurity regions of impurity concentration of $1 \times 10^{19} \sim 2.0 \times 10^{20} cm^{-3}$. The depth of the impurity region 702 is 10–20 nm. A numeral 703 represents a gate electrode. As is clear from tie figure, the superimposition of the gate electrode with the impurity region 702 is limited, and the incidental capacity of the correspondent part will be small.

Preferred Embodiment 2

Figure 7B:
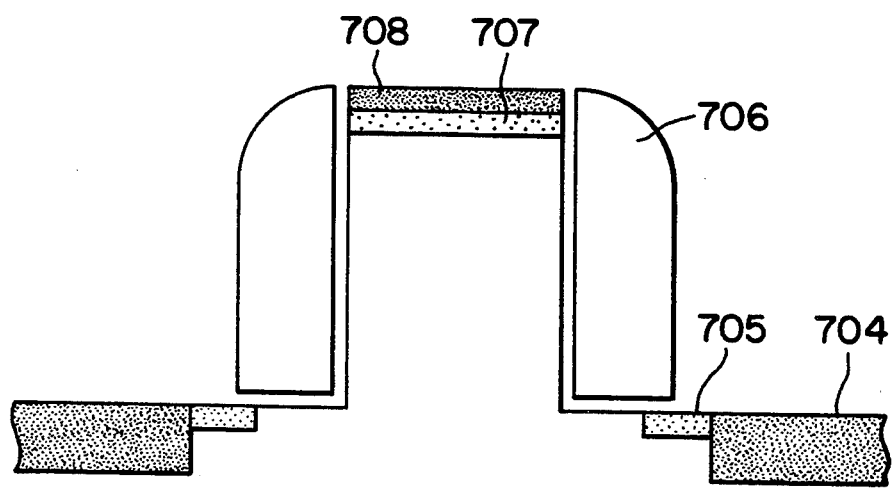

A second preferred embodiment is shown in FIG. 7(B). The example shown in FIG. 7(B) is a MOS transistor (two transistors are depicted in the figure) which is formed on the semiconductor substrate having a protruded region in accordance with the present invention, and which has a low concentration impurity region. (LDD region) Referring to the figure, numerals 704, 708 represent high concentration impurity regions, and the impurity concentration thereof is $1.0 \times 10^{19} \sim 2.0 \times 10^{20} cm^{-3}$. The regions 705, 708 provided adjacent to these impurity regions are LDD regions, and the impurity concentration thereof is $2 \times 10^{17} 18 \ 5 \times 10^{18} cm^{-3}$. A region 706 is a gate electrode. Regions 707 and 708 are manufactured before the protruded part is formed on the semiconductor substrate, while the regions 704 and 705 are manufactured by the LDD manufacturing technique for a normal MOSFET, or by the technique invented by the present inventors.

Although LDD regions are provided both on a source side as well as on a drain side according to the figure, the LDD region can be formed on either side.

Preferred Embodiment 3

A third preferred embodiment is shown in FIG. 8(A). The example shown in FIG. 8(A) represents an EEPROM device (two EEPROM devices are depicted in the figure) formed on the semiconductor substrate having a protruded region in accordance with the present invention. Numerals 801 and 802 represent impurity regions, while 803 is a floating gate and 804 a control gate. In order to manufacture the device, above-mentioned process can be utilized.

The thickness of the gate oxide film of the floating gate is thinner in the region 805 indicated by dotted circle in the figure, compared with the other regions. By thinning the gate oxide film in this manner, a tunnel current is run when a high voltage (10–20 V) is applied to the control gate, and this is accumulated in the floating gate.

In order to partially thin the gate oxide film, before the semiconductor film for manufacturing the floating gate is formed on the surface of the protruded part, in the process of forming the gate oxide film, after the gate oxide film is once formed, only the upper part of the oxide film of the protruded part is to be etched by a plasma isotropic etching. By forming the gate oxide film again thereafter, the structure shown in the figure can be obtained.

Preferred Embodiment 4

A fourth preferred embodiment is shown in FIG. 8(B). The example shown in FIG. 8(B) represents an EEPROM device (two EEPROM devices are depicted in the figure) formed on the semiconductor substrate having a protruded region in accordance with the present invention. Numerals 806, 807, 808, 809 are impurity regions, while 810 is a floating gate, and 811 a control gate. In order to manufacture the device, the above-mentioned process can be utilized.

Of the impurity regions 807, 808, 809, the impurity concentration of 808 is the largest. The sandwiched structure as this is formed by the impurity diffusion before the protruded part is formed. By adopting this structure, a tunnel current is generated from the center part of a dotted circle 812 shown in the figure, i.e. from the part of the impurity layer 808. This is due to the grading of impurity concentration. By forming the structure like this, the injection of the charge can be carried out stably.

A semiconductor device of high integration was manufactured in accordance with the present invention. Drastic technical innovation was brought by the present invention, in particular, for the integration of EEPROM, which has been delayed due to the problem that two transistors or two transistor parts were conventionally needed in the manufacturing process. Even when the present invention is applied to the manufacturing of the semiconductor integrated circuit other than EEPROM, a part or all of the merits of the characteristics of the present invention can be received. When an EEPROM device (integrated circuit) is to be manufactured, for example, to say nothing of the advantageous aspect of utilizing the present invention for a memory region, the utilizing of the device in accordance with the present invention even for a peripheral circuit, is desirable from the viewpoints of integration of processes as well as of integration.

What is claimed is:

1. A semiconductor device having a source, drain, gate electrode, and a floating gate electrode comprising:
    a semiconductor substrate having a lower surface and a protrusion extending from the lower surface, said protrusion having a side surface and being added with an impurity in an upper portion thereof so that said source of drain is formed in said upper portion of the protrusion;
    said floating gate electrode formed adjacent to said side surface of the protrusion with a first insulating layer therebetween;
    said gate electrode formed adjacent to said floating gate electrode with a second insulating layer therebetween;
    an interlayer insulator formed on said semiconductor substrate, said floating gate electrode and said gate electrode with a contact hole opened through said insulator on the upper portion of said protrusion where the thickness of the interlayer insulator over the lower surface of the semiconductor substrate is greater than the thickness thereof over the protrusion;
    an impurity region formed within said lower surface of the semiconductor substrate to provide the other of said source or drain, said region being located such that said gate electrode extends between said impurity region and said upper portion of the protrusion whereby said source, drain, floating gate electrode, and gate electrode function as a storage device and said source, drain and gate electrode function as a select device to sense the state of the storage device;
    a first wiring extending in a first direction and connected to said upper portion of said protrusion through said contact hole; and
    said impurity region formed within the semiconductor substrate extending in a second direction orthogonal to the first direction.

2. The semiconductor device of claim 1 wherein said gate electrode is selected from a group consisting of doped semiconductor, metal and silicide.

3. The semiconductor device of claim 1 wherein said semiconductor film is encapsulated with said first insulating layer and said second insulating layer.

4. The semiconductor device of claim 1 wherein said side surface of the protrusion is approximately vertical to the major surface of said semiconductor substrate.

5. A semiconductor device comprising:
    a semiconductor substrate having a plurality of protrusions arranged in a row and column form, each of said protrusions having a side surface and being added with an impurity in an upper portion thereof to provide a source of drain;
    a plurality of semiconductor elements associated with said protrusions, respectively where each of said semiconductor elements comprises:
        a semiconductor film comprising a floating gate electrode and formed adjacent to said side surface of the protrusion with a first insulating layer therebetween;
        a gate electrode formed adjacent to said semiconductor film with a second insulating layer therebetween; and
        an impurity region formed within said semiconductor substrate to provide the other of said source or drain, said region located such that semiconductor film extends between said impurity region and said upper portion of the protrusion whereby said source, drain, floating gate electrode, and gate electrode function as a storage device and said source, drain and gate electrode function as a select device to sense the state of the storage device, a plurality of row lines connected with the gate electrodes of the corresponding semiconductor elements arranged along said row lines;

a plurality of first lines connected with the upper portions of the corresponding protrusions arranged along said row or column lines; and a plurality of second lines connected with the impurity regions in the semiconductor substrate, the second lines arranged in the direction of the other of said row and column lines along which the first lines extend.

6. The semiconductor device of claim 5 wherein said gate electrodes are selected from the group consisting of doped semiconductor, metal and silicide.

7. The semiconductor device of claim 5 wherein said semiconductor film is encapsulated with said first insulating layer and said second insulating layer.

8. The semiconductor device of claim 5 wherein said side surface of the protrusions are approximately vertical to a major surface of said semiconductor substrate.

9. The device of claim 1 further comprising a wiring formed on said interlayer insulator wherein said wiring electrically contacts with said upper portion of the protrusion through said contact hole.

10. The device of claim 5 further comprising an interlayer insulator covering said semiconductor substrate having said plurality of semiconductor elements, wherein said plurality of column lines contact the upper portion of the protrusions through contact holes opened through said interlayer insulator.

11. A semiconductor device comprising:
a semiconductor substrate having a plurality of protrusions arranged in a matrix, each of said protrusion having an upper portion and a side surface;
non-volatile memory devices associated with said protrusions, wherein each of said memory device comprises:
source or drain region formed in the upper portion of said protrusion;
the other of the source or drain regions formed in a surface portion of said semiconductor substrate adjacent to said protrusion;
a floating gate formed adjacent to the side surface of said protrusion with a first insulating layer therebetween; and
a gate electrode formed adjacent to said floating gate with a second insulating film therebetween,
a plurality of first wirings extending on and electrically contacting with the upper portions of said protrusions, each said first wiring extending in one of a row direction and column direction of said matrix, said other of the source and drain regions extending in the other of said row and column directions along which the first wirings extend,
wherein an interlayer is provided between said wiring and said semiconductor substrate and wherein said wiring contacts said upper portions of the protrusions through contact holes provided through said interlayer insulator.

12. A semiconductor device comprising:
a semiconductor substrate having a plurality of protrusions in the form of a matrix, each of said protrusion having an upper portion and a side surface;
non-volatile memory devices associated with said protrusions, wherein each of said memory device comprises:
a first impurity region formed in the upper portion of said protrusion;
a second impurity region formed in a surface portion of said semiconductor substrate adjacent to said protrusion;
a floating gate formed adjacent to the side surface of said protrusion with a first insulating layer therebetween; and
as gate electrode formed adjacent to said floating gate with a second insulating film therebetween,
a plurality of first lines connected with the first impurity regions arranged in one of a column and row direction of said matrix;
a plurality of second lines connected with the second impurity regions arranged in the other of said row and column directions along which the first lines extend;
a plurality of gate lines connected with the gate electrodes arranged in one of said column and row directions.

* * * * *